United States Patent [19]
Liebmann et al.

[11] Patent Number: 5,636,131
[45] Date of Patent: *Jun. 3, 1997

[54] GEOMETRIC AUTOGENERATION OF "HARD" PHASE-SHIFT DESIGNS FOR VLSI

[75] Inventors: Lars W. Liebmann, Dutchess County; Mark A. Lavin; Pia N. Sanda, both of Westchester County, all of N.Y.

[73] Assignee: International Business Machines Corporation, Armonk, N.Y.

[*] Notice: The term of this patent shall not extend beyond the expiration date of Pat. No. 5,537,648.

[21] Appl. No.: 440,051

[22] Filed: May 12, 1995

Related U.S. Application Data

[62] Division of Ser. No. 290,625, Aug. 15, 1994, Pat. No. 5,537,648.

[51] Int. Cl.[6] .................. G06F 15/00; G06F 3/00
[52] U.S. Cl. .................. 364/490; 364/488; 364/489; 364/491; 395/500; 395/919; 395/920
[58] Field of Search .................. 364/488, 489, 364/490, 491, 578, 512; 371/22.3; 326/16; 430/312, 313, 314, 322, 323, 324, 5; 348/126; 356/394, 237; 395/921, 923, 919, 922, 51; 250/492.1, 492.2, 398

[56] References Cited

U.S. PATENT DOCUMENTS

| | | | |
|---|---|---|---|
| 4,700,317 | 10/1987 | Watanabe et al. | 364/488 |
| 4,902,899 | 2/1990 | Lin et al. | 250/492.1 |
| 5,246,800 | 9/1993 | Muray | 430/5 |
| 5,249,135 | 9/1993 | Fujita | 395/919 |
| 5,286,581 | 2/1994 | Lee | 430/5 |
| 5,326,979 | 7/1994 | Kawasaki et al. | 250/492.2 |
| 5,358,806 | 10/1994 | Haraichi et al. | 430/5 |
| 5,537,648 | 7/1996 | Liebmann et al. | 364/490 |

*Primary Examiner*—Kevin J. Teska
*Assistant Examiner*—Jacques Louis-Jacques
*Attorney, Agent, or Firm*—Whitham, Curtis, Whitham & McGinn; Charles W. Peterson, Jr.

[57] ABSTRACT

An apparatus implemented in a computer aided design (CAD) system automatically generates phase shifted mask designs for very large scale integrated (VLSI) chips from existing circuit design data. The system uses a series of basic geometric operations to design areas requiring phase assignment, resolve conflicting phase assignments, and eliminate unwanted phase edges. This apparatus allows automatic generation of phase shift mask data from any circuit design that allows for phase shifting. Since the dimensional input for all geometric operations is directly linked to the design ground rules given to the circuit designers, any designable circuit layout can also be phase shifted with this algorithm. The autogeneration of phase shift patterns around an existing circuit design is broken down into four major tasks: 1. Define areas that need a phase assignment; 2. Make a first pass phase assignment unique to each critical feature and define "runs" of interrelated critical features; 3. Propagation phase assignment through the "runs"; and 4. Design trim features.

1 Claim, 19 Drawing Sheets

GEOMETRIC AUTOGENERATION OF "HARD" PHASE-SHIFT DESIGNS FOR VLSI

CROSS REFERENCE TO RELATED APPLICATION

This application is a divisional of application Ser. No. 08/290,625 filed Aug. 15, 1994 now U.S. Pat. No. 5,537,648.

BACKGROUND OF THE INVENTION

1. Field of the Invention

The present invention generally relates to the manufacture of very large scale integrated (VLSI) circuit devices and, more particularly, to resolution enhancement of photolithographic images through the use of phase shifted masks. More specifically, a method and apparatus are provided to autogenerate data for creating phase shifted masks from existing circuit designs.

2. Description of the Prior Art

A very large scale integrated (VLSI) complementary metal oxide semiconductor (CMOS) chip is manufactured on a silicon wafer by a sequence of material additions (i.e., low pressure chemical vapor depositions, sputtering operations, etc.), material removals (i.e., wet etches, reactive ion etches, etc.), and material modifications (i.e., oxidations, ion implants, etc.). These physical and chemical operations interact with the entire wafer. For example, if a wafer is placed into an acid bath, the entire surface of the wafer will be etched away. In order to build very small electrically active devices on the wafer, the impact of these operations has to be confined to small, well defined regions.

Lithography in the context of VLSI manufacturing of CMOS devices is the process of patterning openings in photosensitive polymers (sometimes referred to as photoresists or resists) which define small areas in which the silicon base material is modified by a specific operation in a sequence of processing steps. The manufacturing of CMOS chips involves the repeated patterning of photoresist, followed by an etch, implant, deposition, or other operation, and ending in the removal of the expended photoresist to make way for a new resist to be applied for another iteration of this process sequence.

The basic lithography system consists of a light source, a stencil or photomask containing the pattern to be transferred to the wafer, a collection of lenses, and a means for aligning existing patterns on the wafer with patterns on the mask. Since a wafer containing from fifty to one hundred chips is patterned in steps of one to four chips at a time, these lithography tools are commonly referred to as steppers. The resolution, R, of an optical projection system such as a lithography stepper is limited by parameters described in Rayleigh's equation:

$$R = k_1 \frac{\lambda}{NA} \quad (1)$$

where $\lambda$ is the wavelength of the light source used in the projection system and NA is the numerical aperture of the projection optics used. $k_1$ is a factor describing how well a combined lithography system can utilize the theoretical resolution limit in practice and can range from 0.8 down to 0.5 for standard exposure systems. The highest resolution in optical lithography is currently achieved with deep ultra violet (DUV) steppers operating at 248 nm wavelengths, but mid ultra violet (MUV) steppers with a wavelength of 356 nm are also in widespread use.

Conventional photomasks consists of chromium patterns on a quartz plate, allowing light to pass wherever the chromium is removed from the mask. Light of a specific wavelength is projected through the mask onto the photoresist coated wafer, exposing the resist wherever hole patterns are placed on the mask. Exposing the resist to light of the appropriate wavelength causes modifications in the molecular structure of the resist polymers which allows developer to dissolve and remove the resist in the exposed areas. (Negative resist systems allow only unexposed resist to be developed away.) The photomask, when illuminated, can be pictured as an array of individual, infinitely small light sources which can be either turned on (points in clear areas) or turned off (points covered by chrome). If the amplitude of the electric field vector which describes the light radiated by these individual light sources is mapped across a cross section of the mask, a step function will be plotted reflecting the two possible states that each point on the mask can be found in (light on, light off).

These conventional photomasks are commonly referred to as chrome on glass (COG) binary masks, due to the binary nature of the image amplitude. The perfectly square step function exists only in the theoretical limit of the exact mask plane. At any distance away from the mask, such as in the wafer plane, diffraction effects will cause images to exhibit a finite image slope. At small dimensions, that is, when the size and spacing of the images to be printed are small relative to the $\lambda/NA$ (NA being the numerical aperture of the exposure system), electric field vectors of adjacent images will interact and add constructively. The resulting light intensity curve between the features is not completely dark, but exhibits significant amounts of light intensity created by the interaction of adjacent features. The resolution of an exposure system is limited by the contrast of the projected image, that is the intensity difference between adjacent light and dark features. An increase in the light intensity in nominally dark regions will eventually cause adjacent features to print as one combined structure rather than discrete images.

The quality with which small images can be replicated in lithography depends largely on the available process latitude; that is, the amount of allowable dose and focus variation that still results in correct image size. Phase shifted mask (PSM) lithography improves the lithographic process latitude or allows operation of a lower $k_1$ value (see equation 1) by introducing a third parameter on the mask. The electric field vector, like any vector quantity, has a magnitude and direction, so in addition to turning the electric field amplitude on and off, it can be turned on with a 0° phase or turned on with a 180° phase. This phase variation is achieved in PSMs by modifying the length that a light beam travels through the mask material. By recessing the mask by the appropriate depth, light traversing the thinner portion of the mask and light traversing the thicker portion of the mask will be 180° out of phase; that is, their electric field vectors will be of equal magnitude but point in exactly opposite directions so that any interaction between these light beams results in perfect cancellation. For more information on PSM, the reader is referred to "Phase-Shifting Mask Strategies: Isolated Dark Lines", Marc D. Levenson, *Microlithography World*, March/April 1992, pp. 6–12.

The limits of PSM lithography can be uniquely challenged by the manufacture of high-performance logic derivatives of advanced Dynamic Random Access Memory (DRAM) technologies. These technologies are entering development cycles with immediate requirements for sub-quarter micron printed gate lengths and tight dimensional control on the gate structures across large chip areas. Since these logic technologies are based on shrinking the gate length in an established DRAM technology, the overall layout pitch remains constant for all critical mask levels, resulting in narrow, optically isolated lines on the scaled gate level. The requirement for tight line width control on narrow isolated lines drives the requirement of phase edge PSMs for these logic applications.

Phase edge PSM lithography makes use of contrast enhancement caused by a phase transition under an opaque feature on a mask. This phase transition is achieved by etching an appropriate depth into the quartz mask substrate on one side of a narrow line structure on the mask. Not all narrow line structures on the mask close upon themselves, some edges of the etched region will terminate in bare quartz regions. Since the 180° phase transition forces a minimum in the image intensity, narrow dark lines will be printed by these excess phase edges. Currently, the unwanted images are erased using a trim mask, a second mask that transmits light only in regions left unexposed by the residual phase edge.

Even though resolution enhancement through the use of hard phase shifted masks (frequency doubling masks) has been extensively proven, implementation of this technique is critically dependent on computer assisted design (CAD) technology that can modify existing circuit designs to incorporated the additional design levels needed to build a phase shifted mask. Design modifications consist of defining regions on the mask that require phase shifting (i.e., by etching into the mask substrate) relative to the rest of the mask, and of designs added to eliminate lines printed by unwanted phase edges. The basic concept of creating a phase transition across any small feature is easily realized and can be done, given sufficient time, on a graphics terminal by hand. The challenge that needs to be met before introducing hard phase shifters to VLSI product programs lies in the rapid, reliable design modifications of complex chip designs. No known CAD system exists that can efficiently translate phase shift design rules into regions that need phase assignment, as is necessary for all light field design levels such as the gate level, typically one of the most critical levels for linewidth control.

SUMMARY OF THE INVENTION

It is therefore an object of the present invention to provide a method implemented in a CAD program to automatically generate phase shifted mask designs for VLSI chips.

It is another object of the invention to provide a CAD system which is capable of receiving as input data existing VLSI circuit designs and automatically generating as an output phase shifted mask designs.

The computer aided design (CAD) system according to the invention uses a series of basic geometric operations to design areas requiring phase assignment, group sets of interrelated features into runs, resolve conflicting phase assignments, and eliminate unwanted phase edges. This process allows automatic generation of phase shift mask data from any circuit design that allows for phase shifting. Since the dimensional input for all geometric operations is directly linked to the design ground rules given to the circuit designers, any designable circuit layout can also be phase shifted with this algorithm.

The autogeneration of phase shift patterns around an existing circuit design can be broken down into four major tasks:

1. Define areas that need a phase assignment: After locating the features that need a phase transition in order to print with sufficient process latitude, phase regions are created by expanding the features in question by an amount deemed as the minimum necessary separation between structures with the same phase assignment. Since a phase transition is required across the major axis of the critical features, the expanded shapes are separated into two halves, using the original critical shape as a cutline. Merging all abutting or overlapping phase regions ensures unique phase assignment to each region. Regions in the design that do not allow for phase termination due to space limitations that would prevent the subsequent removal of residual phase edges are blocked out by designing "dummy" phase regions by filling all gaps in the design smaller than the required phase trim width. These dummy regions are merged in with the critical phase regions if they abut or overlap them, ensuring that edges of phase regions always are placed in design regions where they can be subsequently removed. The result consists of polygons that fill the space between critical features, requiring a phase transition, and any areas that do not allow for phase termination due to space constraints.

2. Make a first pass phase assignment unique to each critical feature and define "runs" of interrelated critical features: By tagging each phase region as "left" and "right" relative to a critical feature two goals are accomplished:
   a. Isolated features, that have no phase regions from other critical features interfering with their own, now have a phase transition, left and right can be arbitrarily associated with 0° and 180° phase regions.
   b. Closely spaced features are linked together in "runs", characterized by the fact that each critical feature's phase assignment interferes with its neighbor's assignment. These runs are defined in the algorithm by a series of phase regions that are tagged as "left" and "right" concurrently. The features linking the interfering phase regions together are the critical features that border each phase region.

3. Propagation of phase assignment through the "runs": By arbitrarily selecting a uniquely assigned phase region (i.e., "left" with no interference from "right" or vice versa) as the starting point of a "run", and then propagating alternating phase assignments across the entire run by simply assigning a phase opposite to that of the previous member in the run, all "runs" across the entire chip are processed in parallel (this has significant data processing advantages).

4. Design trim feature: A final series of geometric operations is used to clean up the design and to design assist features that will be used to erase lines printed by unwanted phase transitions.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
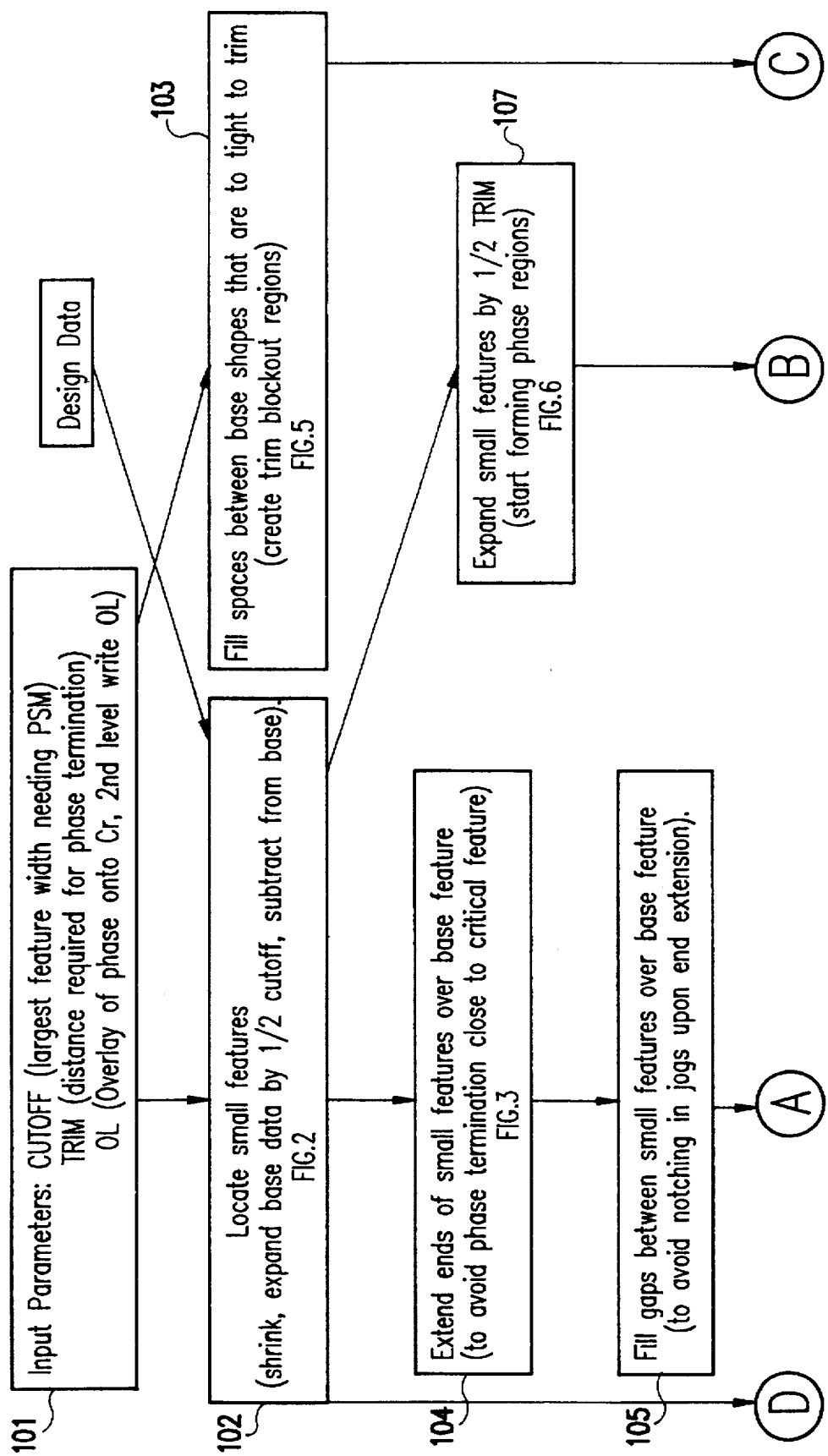
FIGS. 1A, 1B and 1C taken together, are a flow diagram showing the logic of the computer implemented method according to the present invention.
Figure 1B:
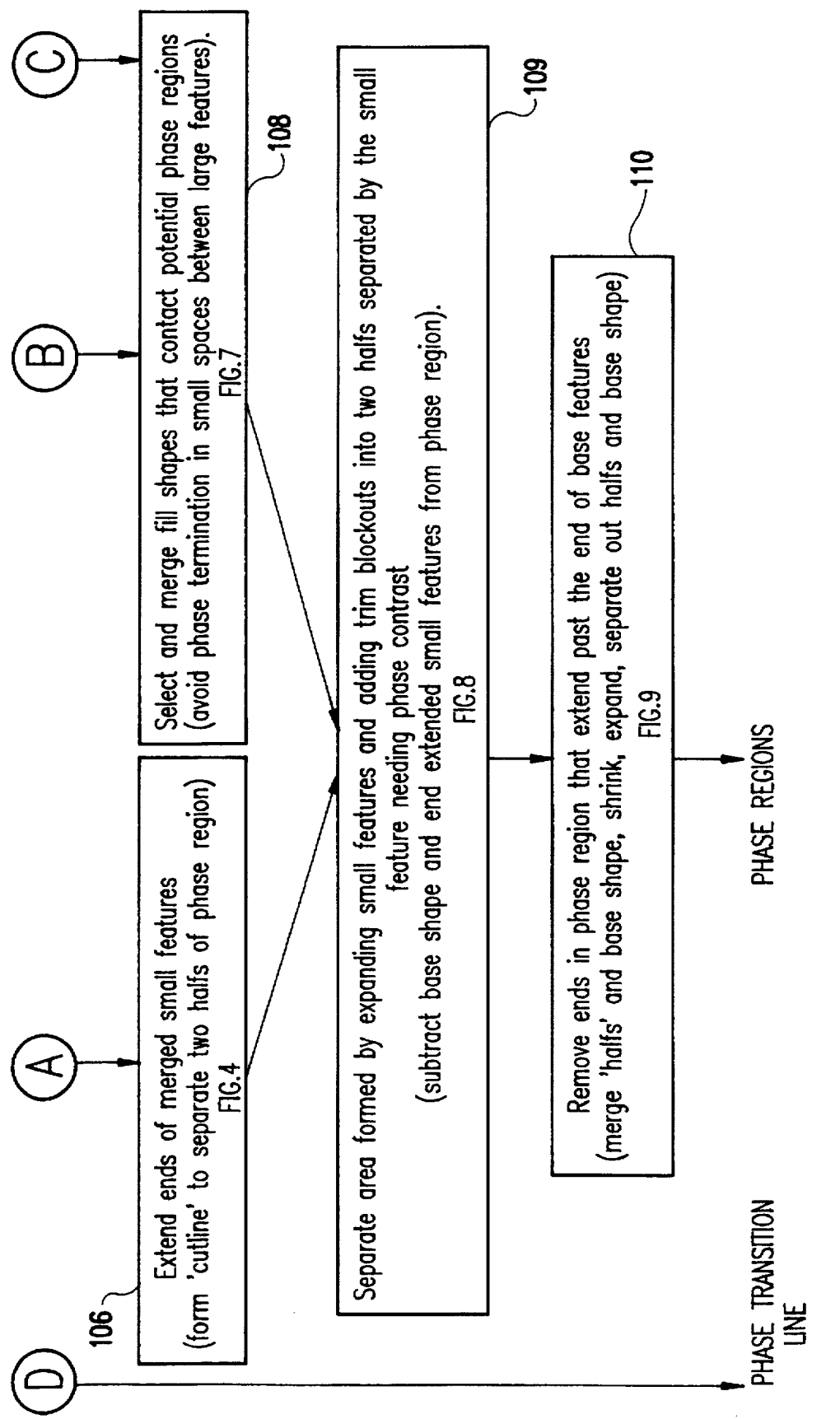
Figure 1C:
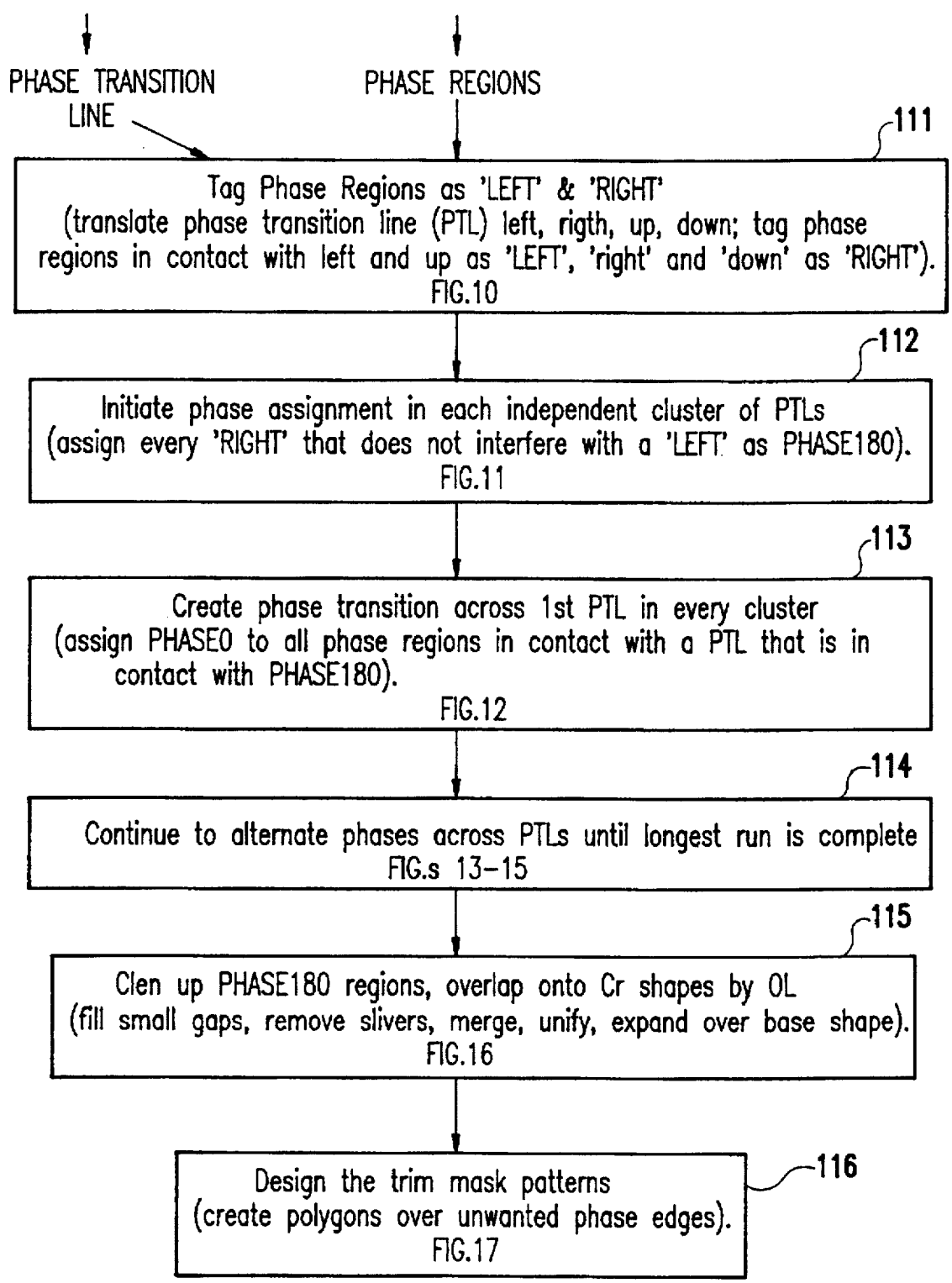

Referring now to the drawings, and more particularly to FIGS. 1A, 1B and 1C there is shown a flow diagram which illustrates the logic of the computer program for the auto-generation of a phase shifted mask design from a typical polygate structure in a VLSI circuit design. The source code for the program can be written in a computer language compatible with a particular CAD program in which it is to be implemented. The CAD system which embodies the invention includes a programmed computer having input/output (I/O) channels respectively connected to receive input data of existing circuit designs and to generate output phase shift mask designs.

Figure 2:
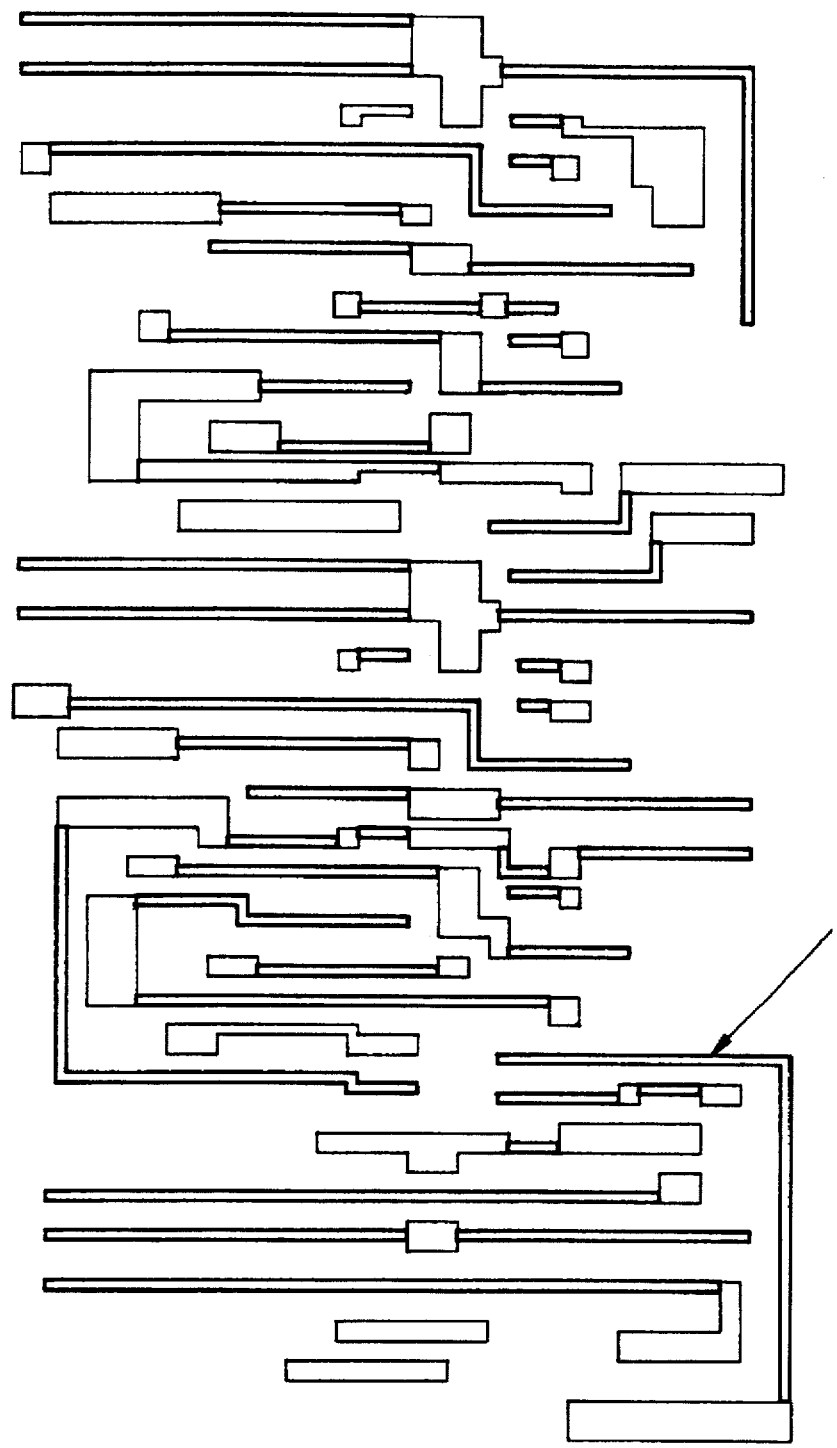
FIG. 2 is a plan view of a portion of a VLSI circuit design used to illustrate the method according to the present invention.
Figure 3:
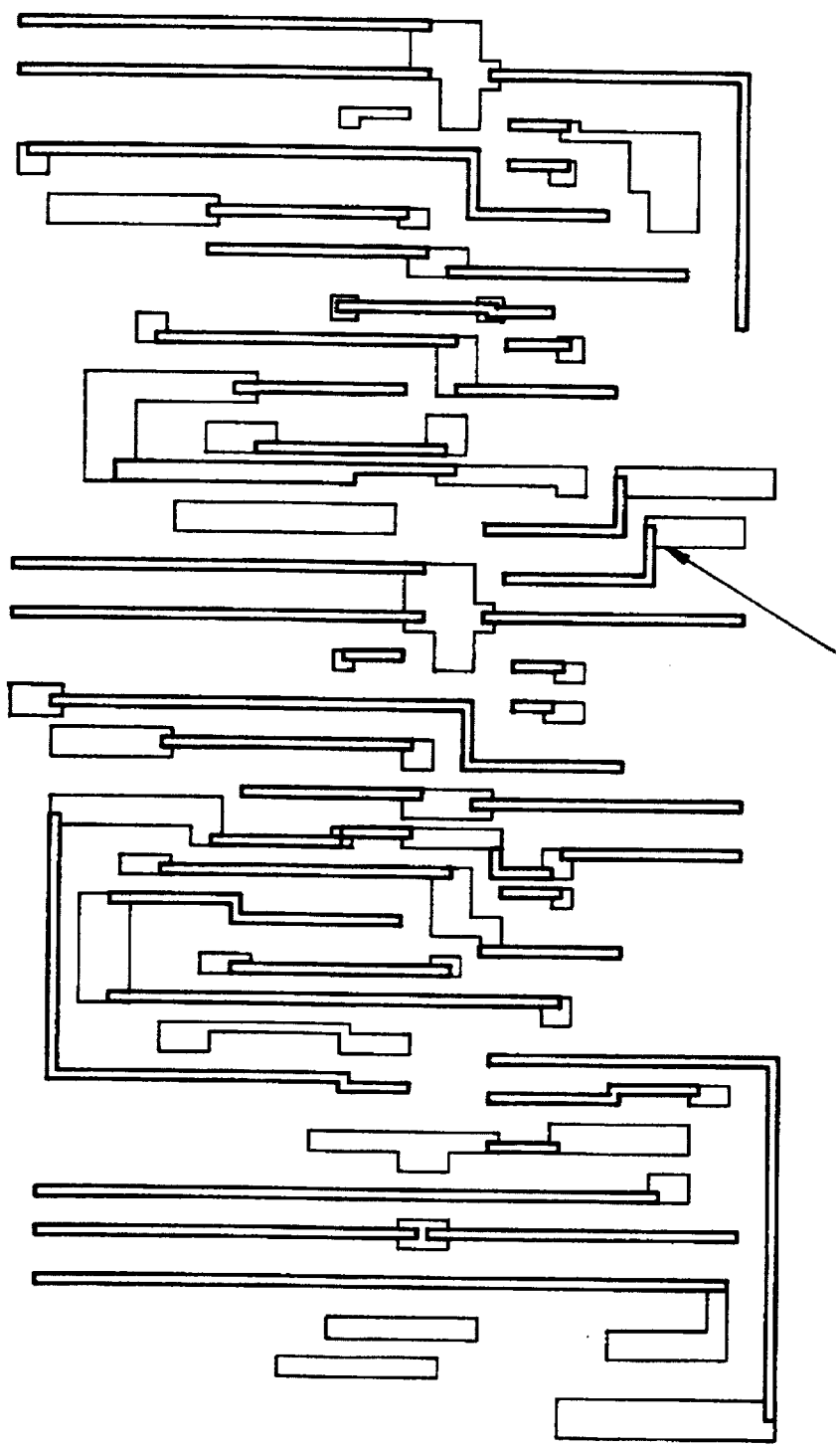
FIG. 3 is a plan view of the VLSI circuit design shown in FIG. 2 with small features extended over base.
Figure 4:
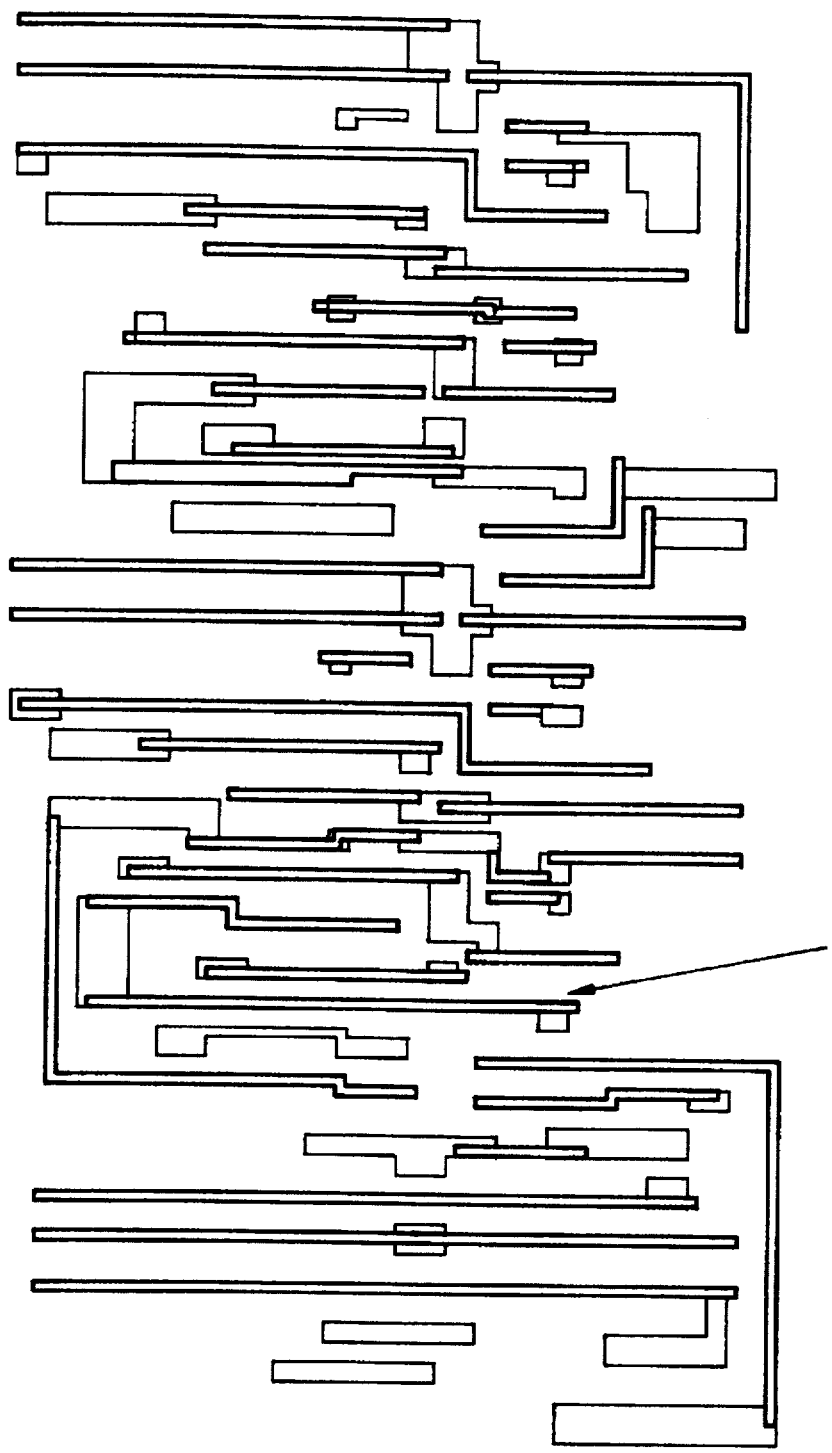
FIG. 4 is a plan view of the VLSI circuit design shown in FIG. 3 with ends of merged small features extended.

With reference first to FIG. 1A, in block 101, the input parameters are established. These include the cutoff (i.e., the largest feature width needing a phase shift mask (PSM)), the trim (i.e., the distance required for phase termination), and overlay or OL (i.e., the overlay of phase onto Cr, second level write OL). These input parameters are passed to blocks 102 and 103. Block 102 also receives the design data for the VLSI circuit design. FIG. 2 illustrates by way of example a portion of a typical VLSI circuit design. In block 102, the small features of the VLSI circuit design are located. These features of the design, in this case polysilicon gate structures (shown in FIG. 2 as shaded-in lines), are deemed critical based on their image size (i.e., <300 nm). Returning to FIG. 1A, the next step in block 104 is to extend the ends of the located small features (i.e., the gates) over the base feature, as shown in FIG. 3. This is done to avoid phase termination close to a critical feature. Next, in block 105, the gaps between small features over the base features are filled in to avoid notching in jogs upon end extension. The ends of the merged small features are extended in block 106 (in FIG. 1B) to form a "cutline" to separate two halves of the phase region, as shown in FIG. 4.

Figure 5:
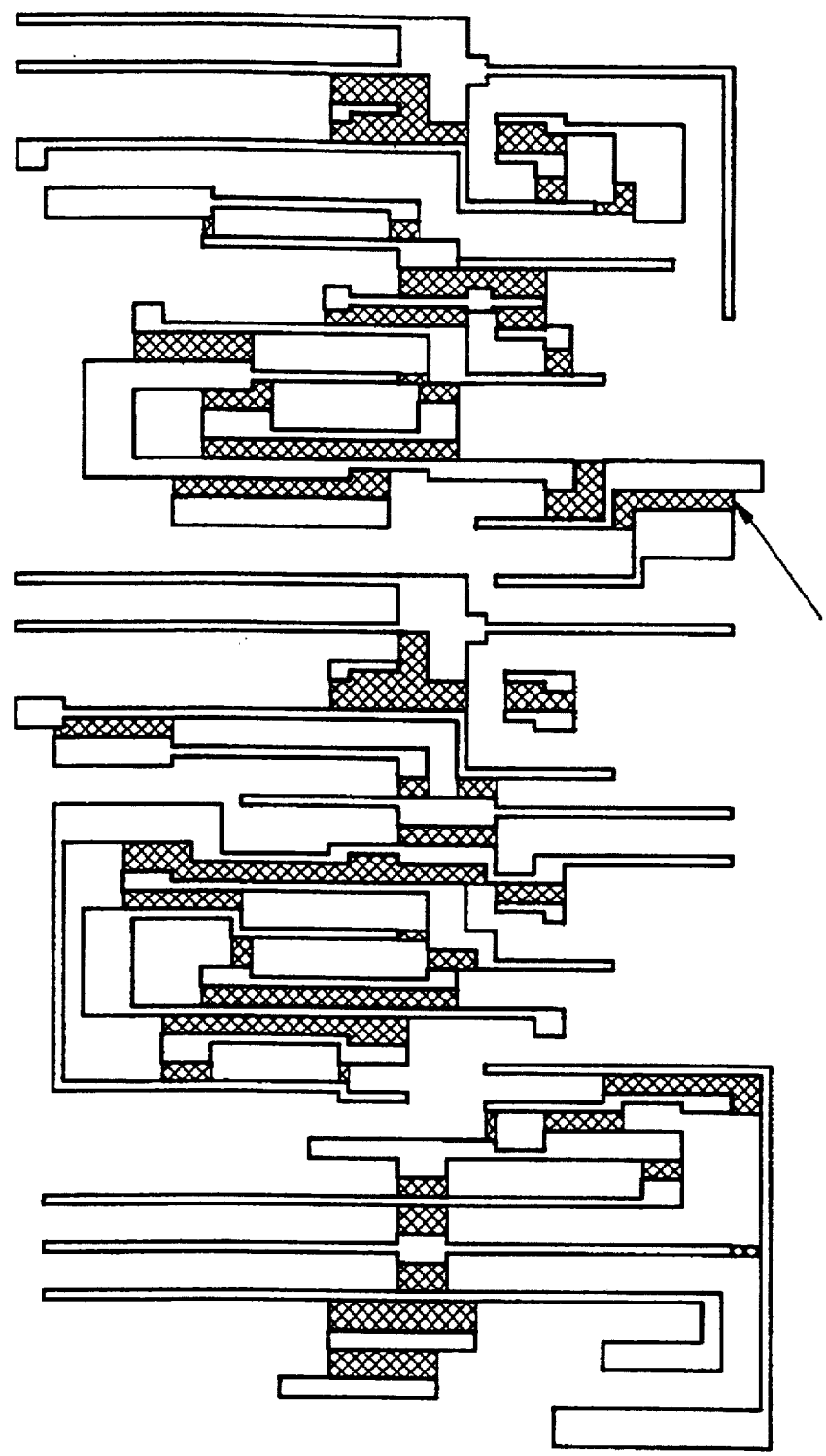
FIG. 5 is a plan view of the VLSI circuit design shown in FIG. 2 with spaces filled between base shapes.
Figure 6:
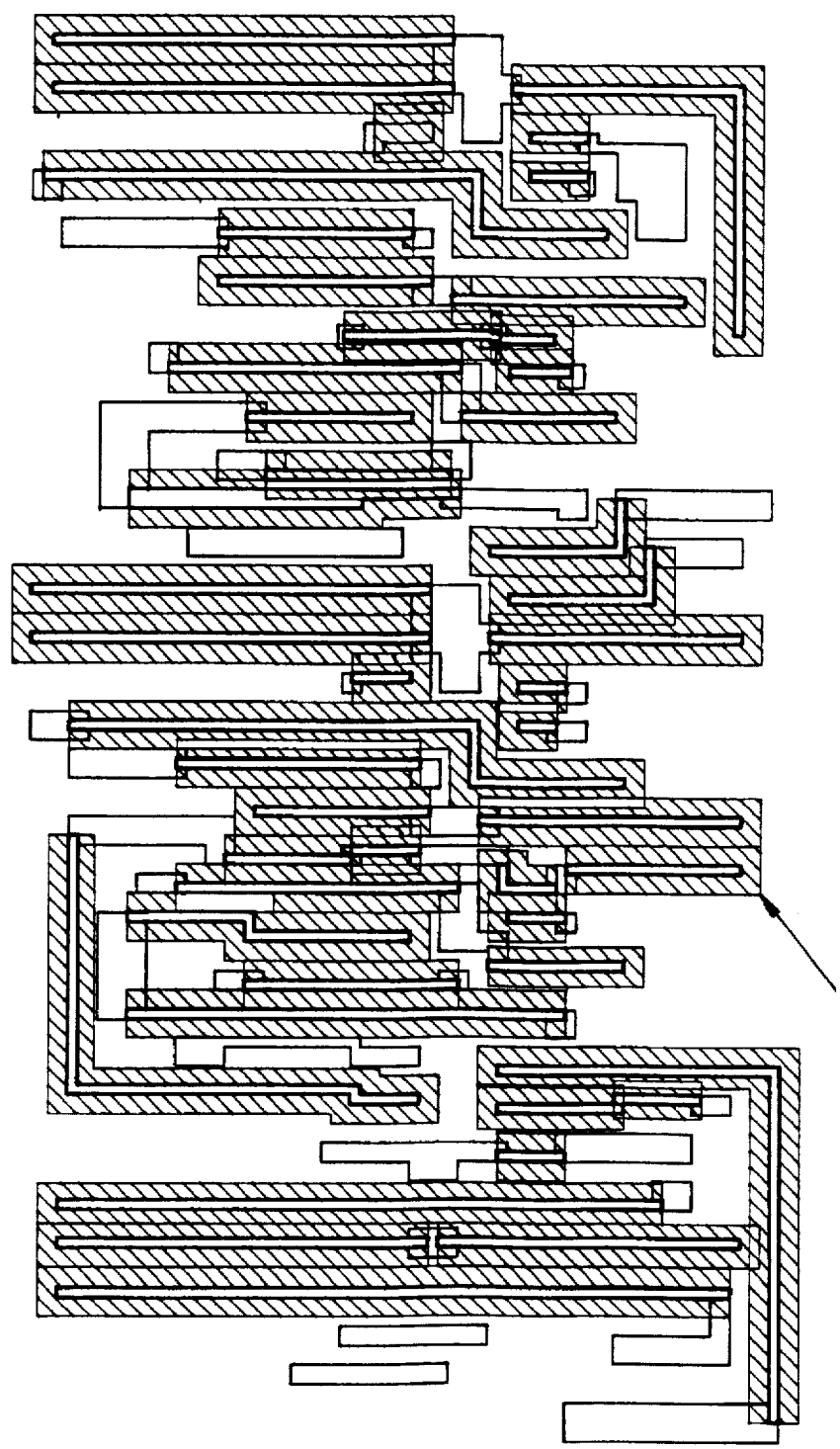
FIG. 6 is a plan view of the VLSI circuit design shown in FIG. 2 with small features expanded.
Figure 7:
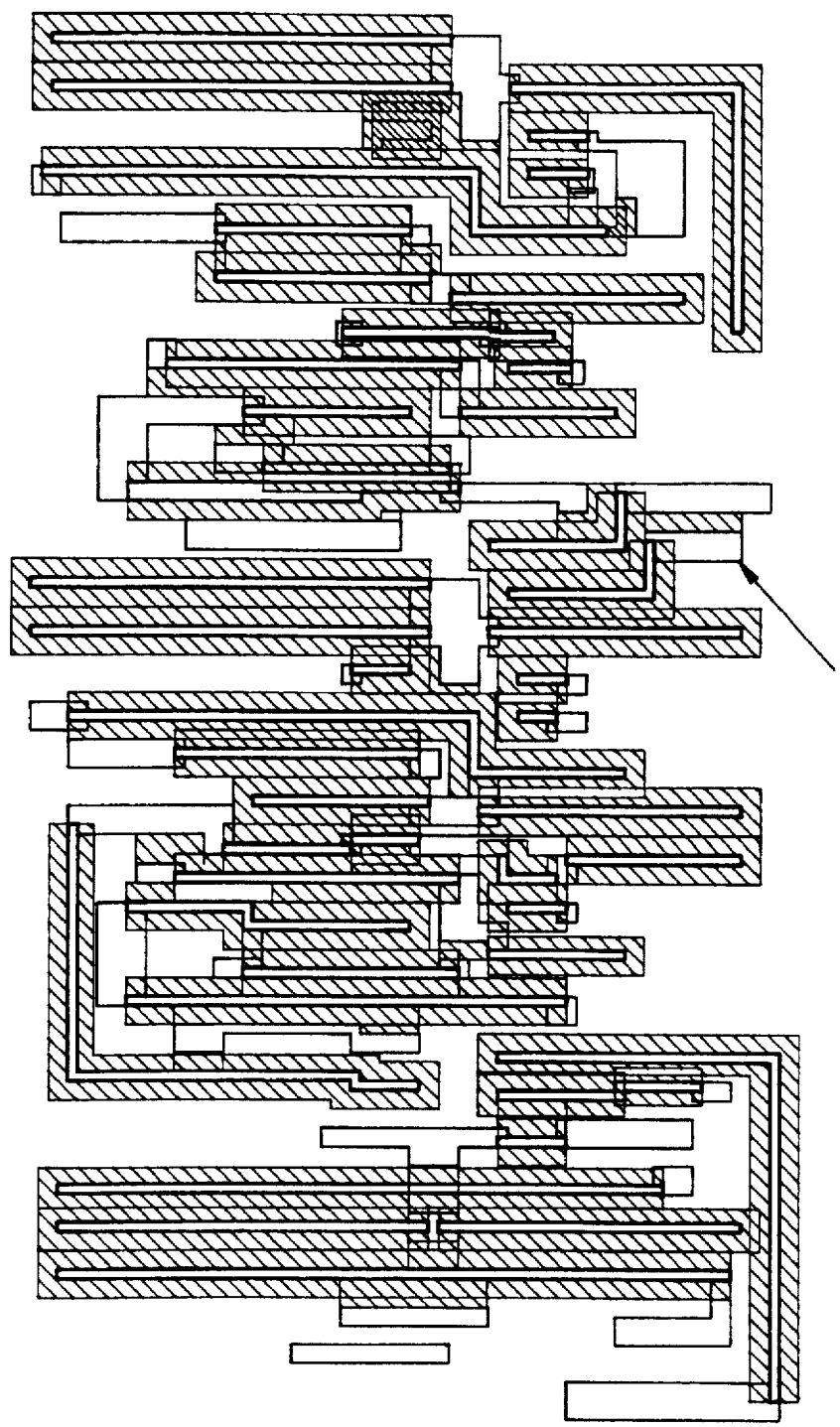
FIG. 7 is a plan view of the VLSI circuit design shown in FIG. 6 with fill shapes that contact potential phase regions merged.

Returning to block 103, starting again with the portion of the VLSI circuit design shown in FIG. 2, the spaces between the base shapes that are too tight to trim are filled to create trim blockout regions, as shown in FIG. 5. In addition, in block 107, the small features located in block 102 are expanded to start forming phase regions, as shown in FIG. 6. The results of the steps performed in blocks 103 and 107 are input to block 108 (in FIG. 1B) where the fill shapes that contact potential phase regions are selected and merged, as shown in FIG. 7. This avoids phase termination in small spaces between large features.

Figure 8:
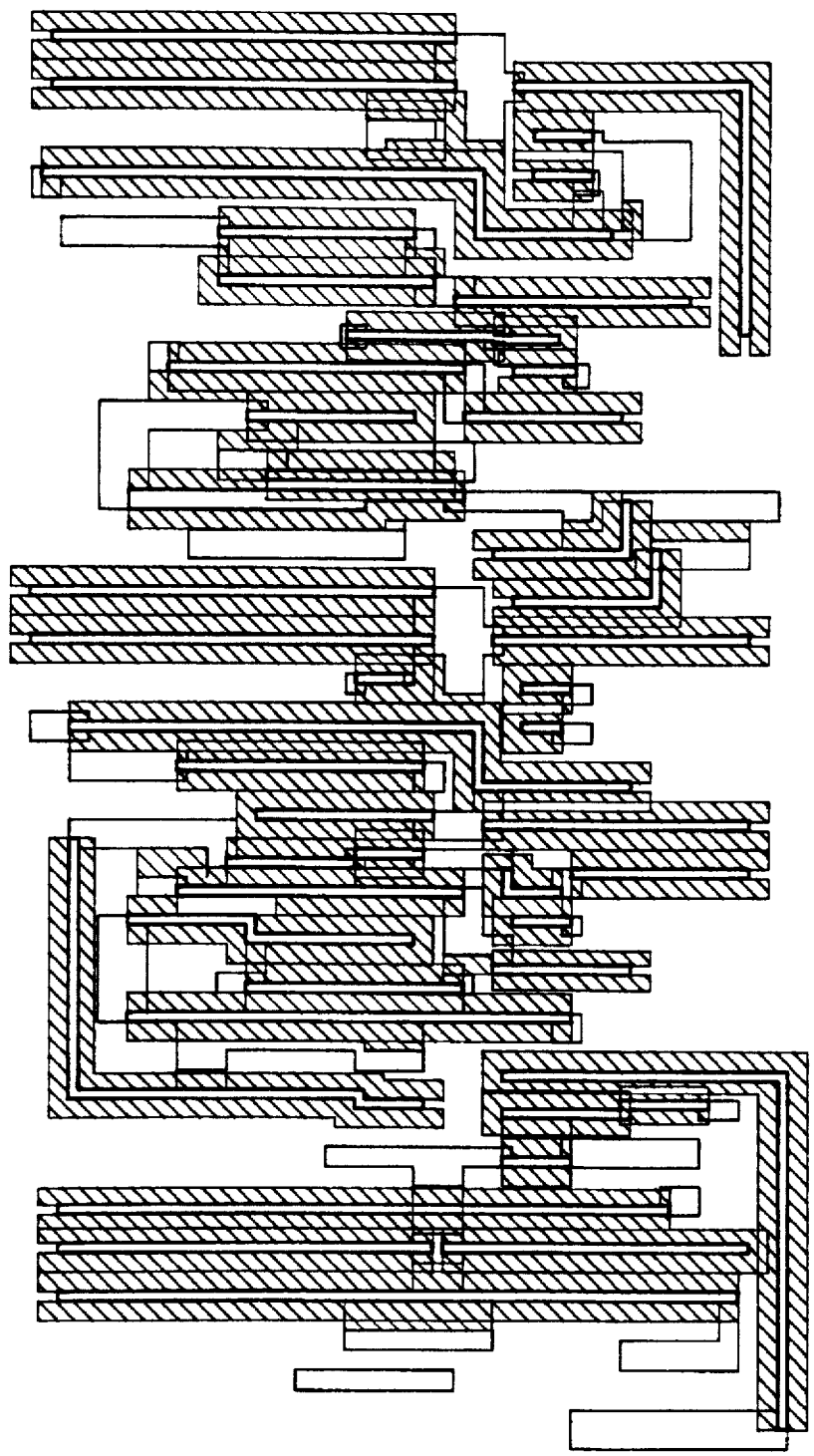
FIG. 8 is a plan view of the VLSI circuit design as shown in FIGS. 4 and 7 with areas formed by expanding small features and adding trim blockouts separated.
Figure 9:
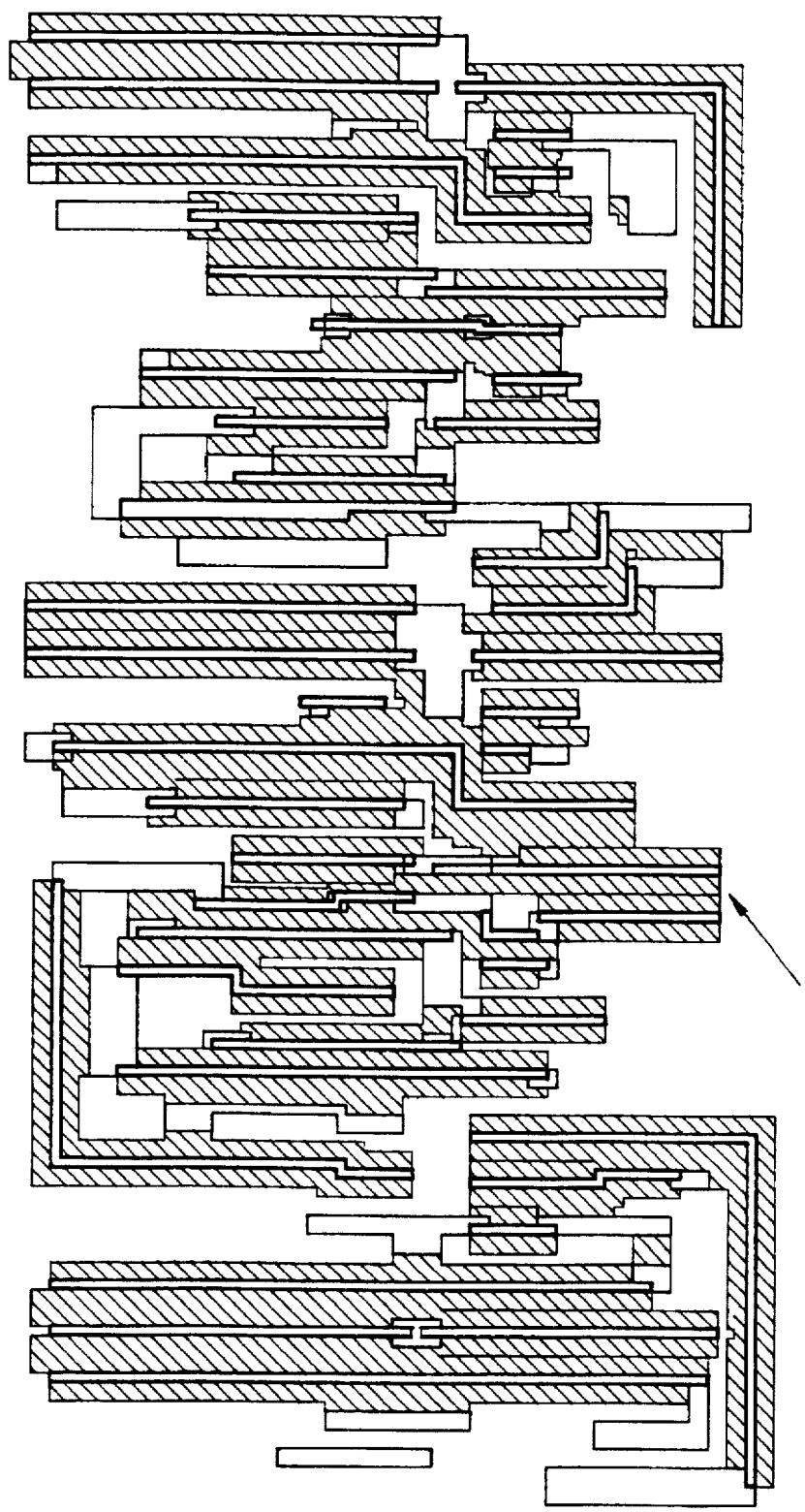
FIG. 9 is a plan view of the VLSI circuit design shown in FIG. 8 with ends in phase regions removed.

The patterns generated in the steps of blocks 106 and 108 (in FIG. 1B) are input to block 109 where the area formed by expanding small features and adding trim blockouts is separated in two halves with the small feature needing phase contrast at the division. This is shown in FIG. 8, where base shapes and end extended small features are subtracted from phase regions. The next step in block 110, is to remove the ends in phase regions that extend past the ends of base features, as is illustrated in FIG. 9. The phase regions are trimmed back to the ends of the critical features or a desired phase termination line. This is done by merging halves and base shapes, then shrinking, expanding, and separating out halves and base shapes.

Figure 10:
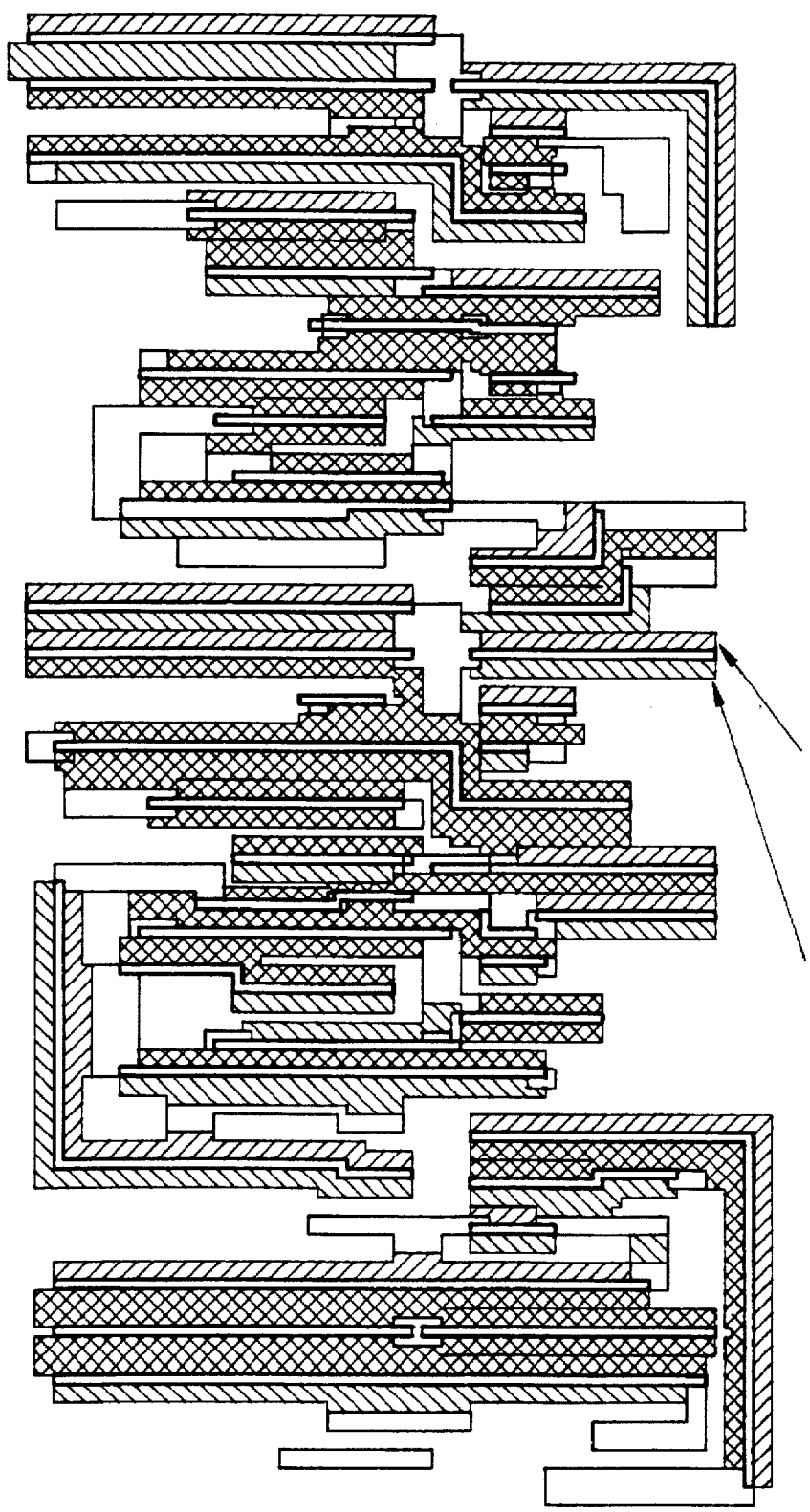
FIG. 10 is a plan view of the VLSI circuit design shown in FIGS. 2 and 9 with phase regions tagged.

Referring now to FIG. 1C, phase transition line (PTL) data from block 102 (FIG. 1A) and phase region data from block 110 (FIG. 1A) are combined in block 111 where phase regions are tagged as "left" and "right". Tagging is shown in FIG. 10 with the convention that a "left" phase region is hatched with lines at 45°, while a "right" phase region is hatched with lines at 135°. Regions which conflict will appear to be double tagged; that is, with "x x x" hatching.

Figure 11:
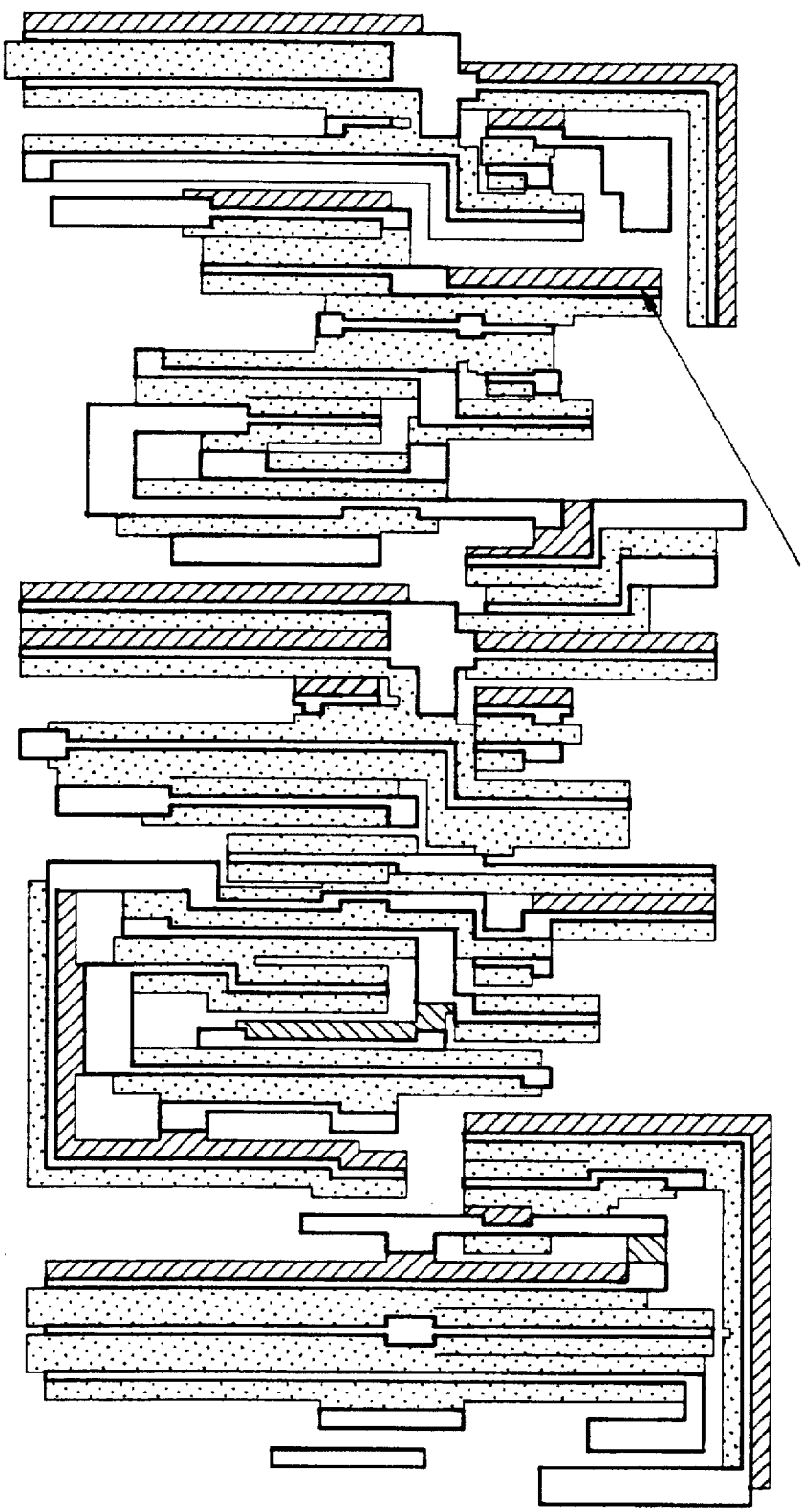
FIG. 11 is a plan view of the VLSI circuit design shown in FIG. 10 with phase assignments initiated.
Figure 12:
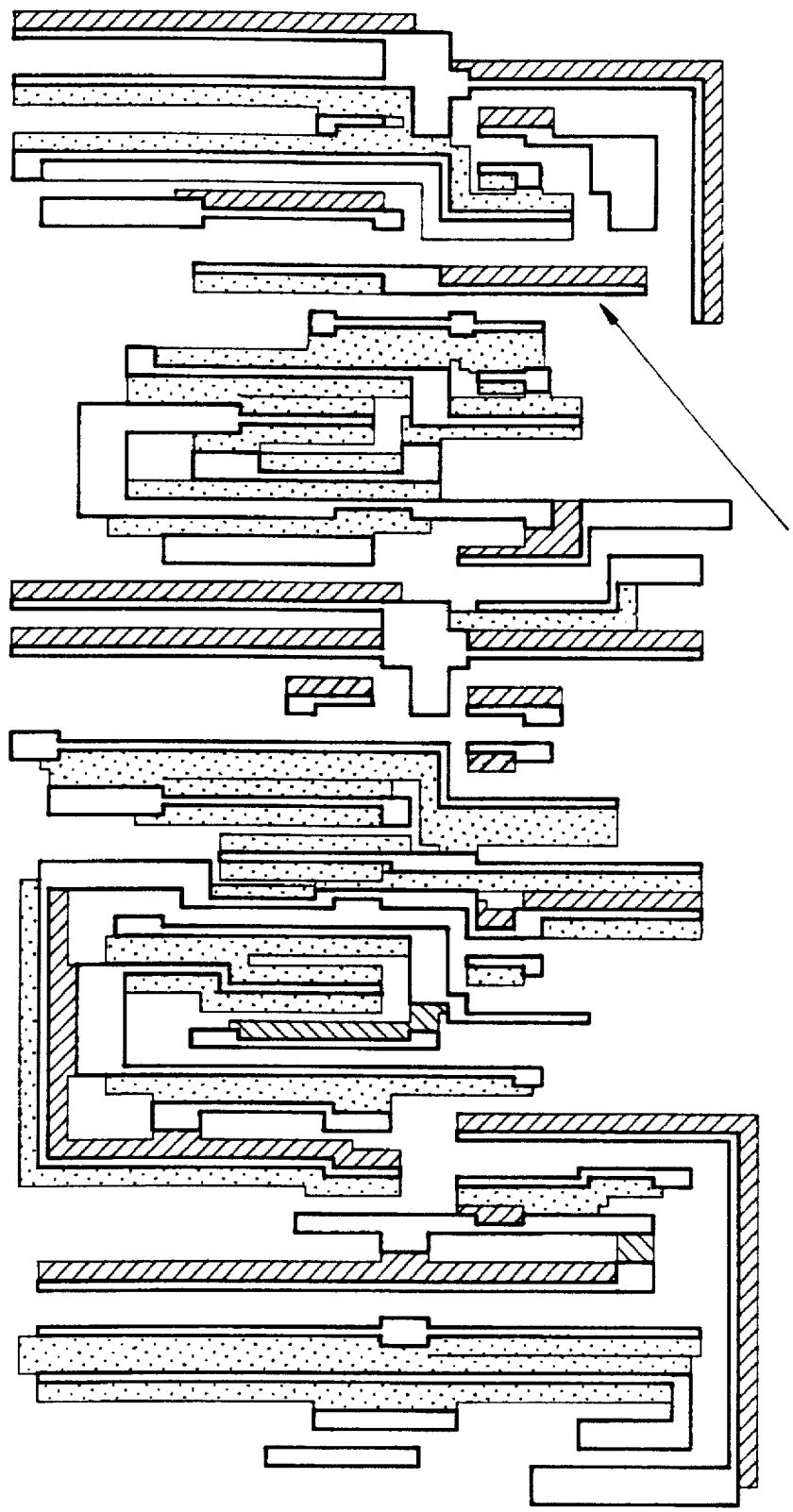
FIG. 12 is a plan view of the VLSI circuit design shown in FIG. 11 with a phase transition across first phase transition line (PTL) in every cluster.
Figure 13:
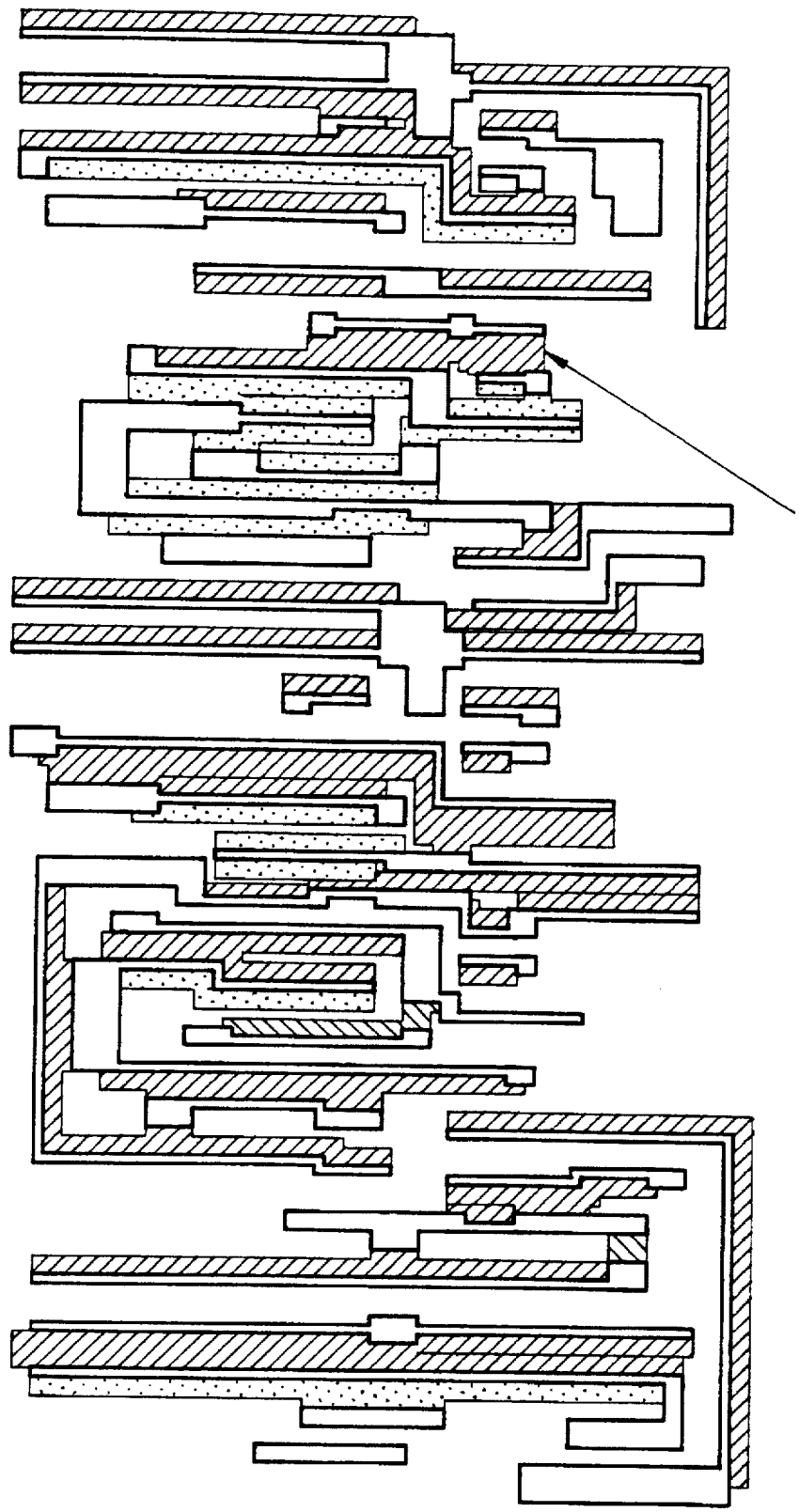
FIGS. 13 to 15 are plan views of the VLSI circuit design with alternating PTLs.
Figure 14:
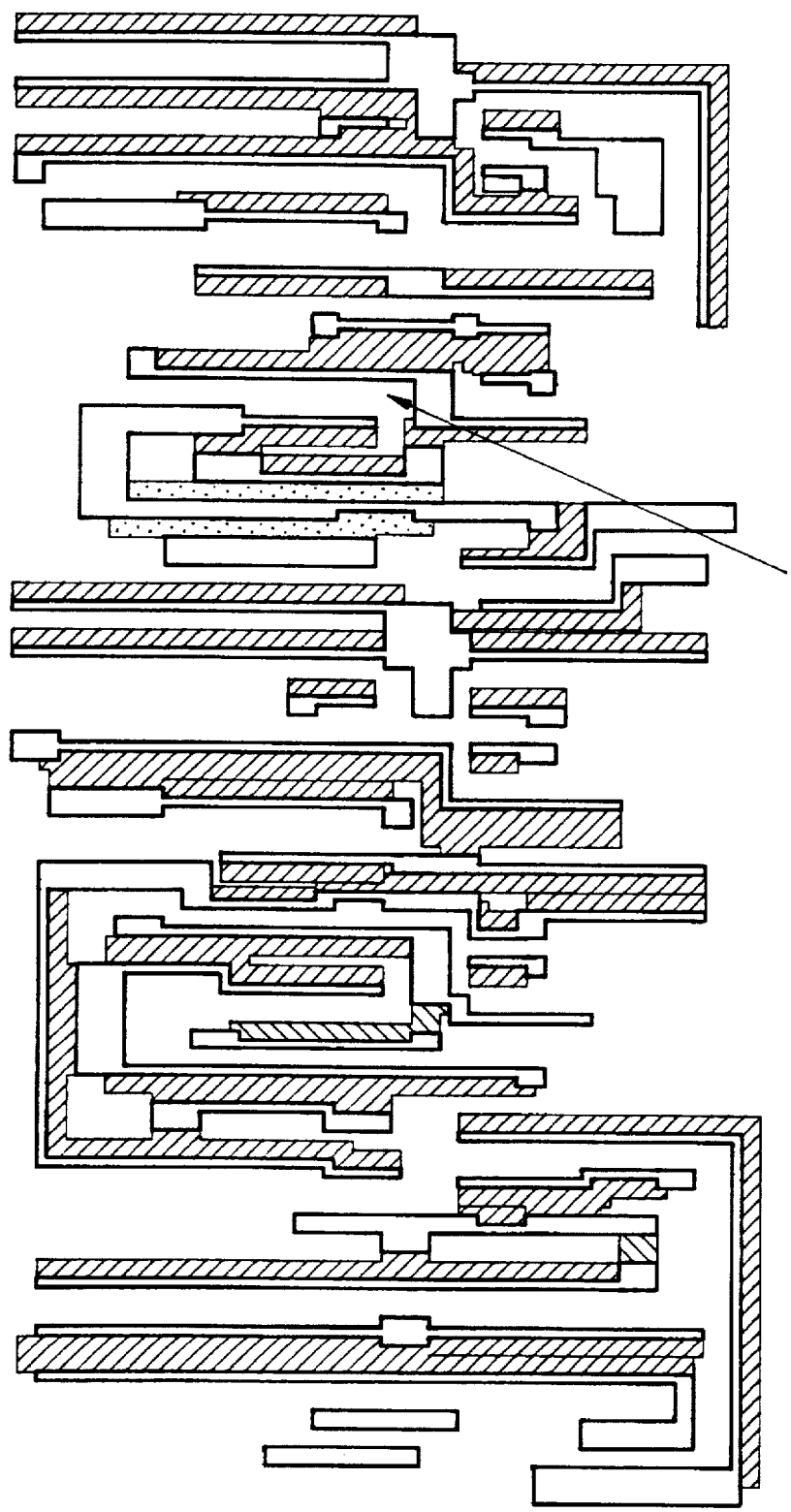
Figure 15:
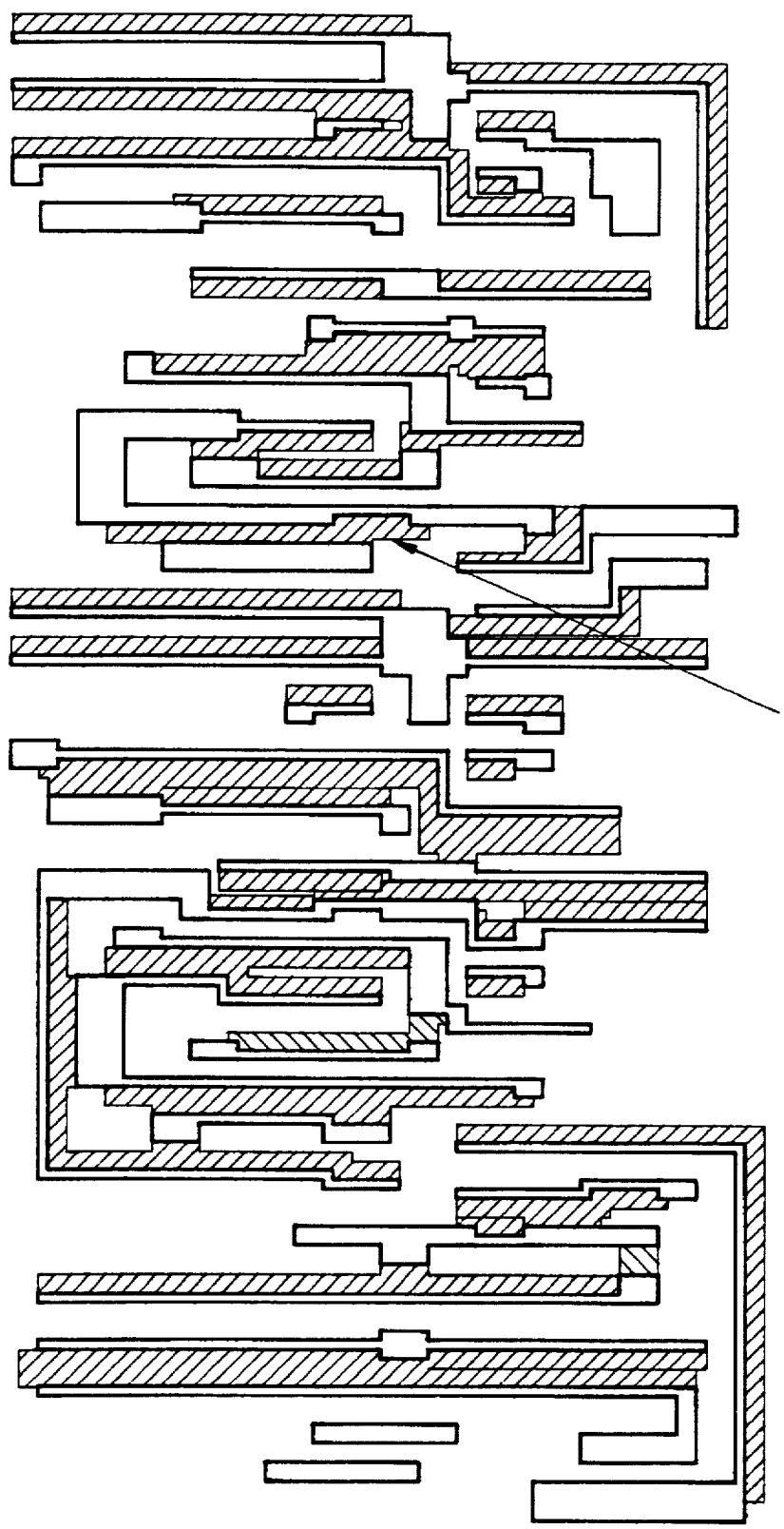

The procedure continues in block 112 where phase assignments are initiated in each independent cluster of phase transition lines (PTLs). At this point all phase regions which were tagged "right" and do not conflict with phase regions tagged "left" are assigned a phase (i.e., PHASE 180°). This step is shown in FIG. 11, where the start of a run of interrelated phase regions is defined by selecting a uniquely defined phase region and assigning it a phase. In the next step in block 113, a phase transition is created across the first PTL in every cluster of PTLs. As is illustrated in FIG. 12, an alternative phase is assigned to regions on the opposite side of a critical feature bounded by a phase regions assigned in a previous step (i.e., PHASE 0° where previous assignment was PHASE 180°). Phase alternation across phase transition lines, shown in block 114, is continued until the longest run is complete. Illustration of this process is shown in FIGS. 13 to 15.

Figure 16:
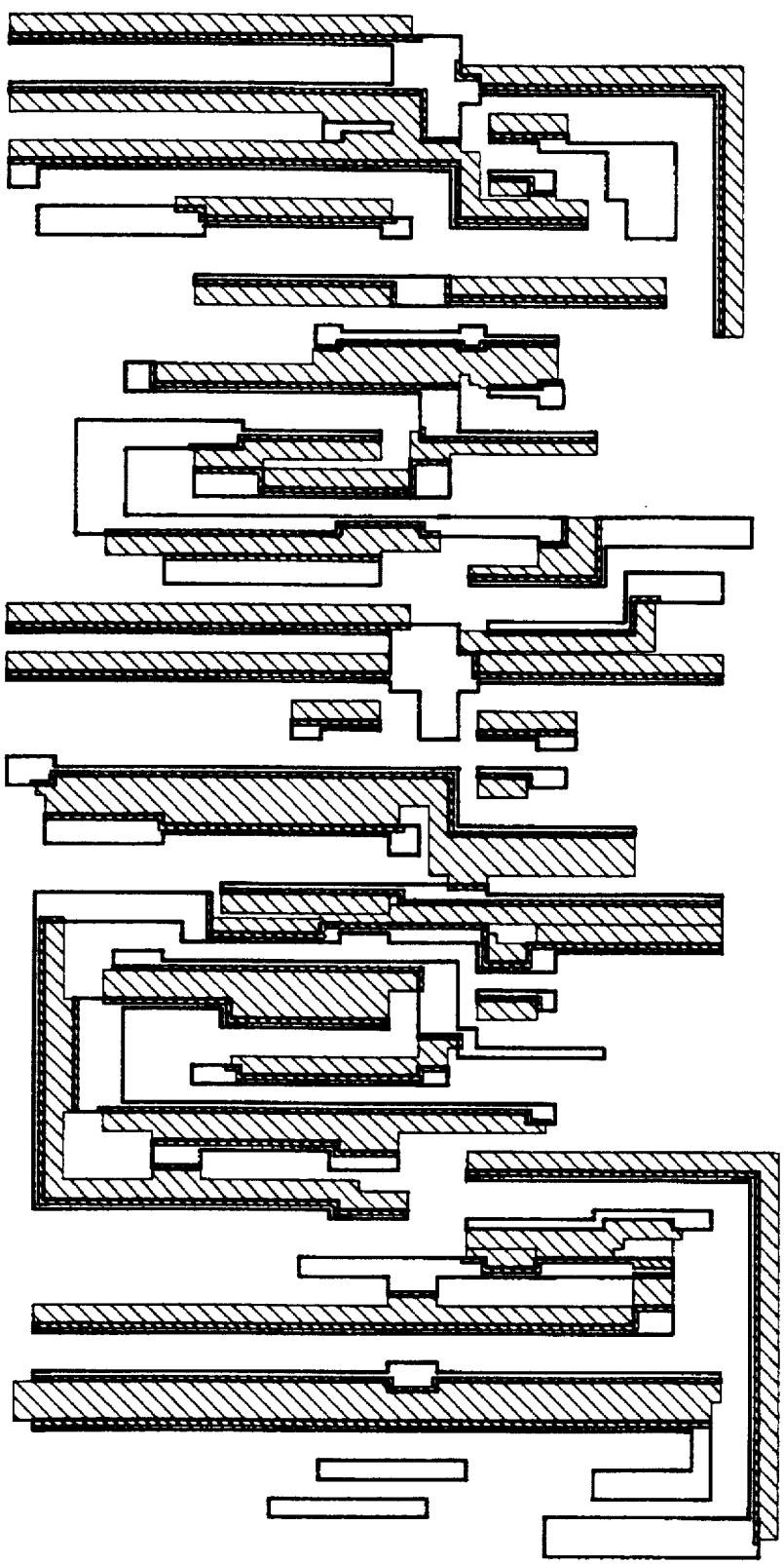
FIG. 16 is a plan view of the VLSI circuit design with PHASE 180 regions cleaned up.
Figure 17:
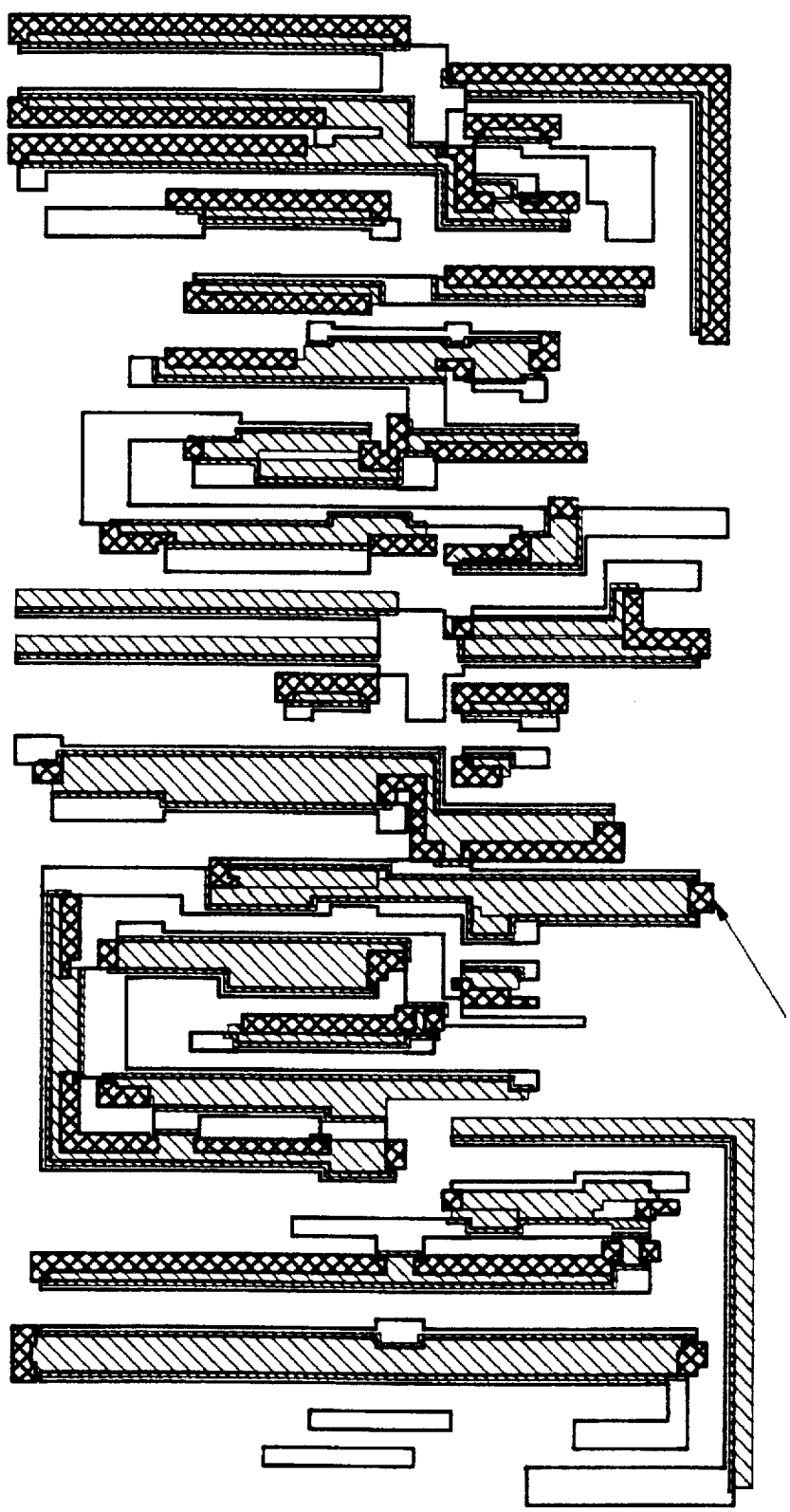
FIG. 17 is a plan view of the VLSI circuit design with the trim mask patterns designed.

Proceeding to block 115, the phase design is cleaned up by filling small gaps and overlapping the phase regions with the regions defining chrome designs on the mask. This process is illustrated in FIG. 16. Finally, in block 116, trim mask patterns are designed. Shown in FIG. 17, the trim features are used to erase unwanted line resulting from residual phase terminations.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A computer aided design (CAD) system for autogenerating a phase shifted mask pattern from existing circuit design dam comprising:

a programmed computer having input and output channels;

input means connected to the input channel for inputting the existing circuit design data to the computer together with predefined input parameters;

scanning means within the computer for scanning the existing circuit design data to locate small features of the circuit design;

definition means within the computer for defining areas that need phase assignment;

said computer being programmed to make a first pass phase assignment for a critical feature and to define runs of interrelated critical features;

said computer further being programmed to propagate phase assignments through the runs and to design trim features for the phase shift mask pattern; and output means connected to the output channel for outputting the phase shifted mask pattern.

* * * * *

UNITED STATES PATENT AND TRADEMARK OFFICE
CERTIFICATE OF CORRECTION

PATENT NO.: 5,636,131
   DATED: June 3, 1997
INVENTORS: Liebmann et al.

It is certified that error appears in the above-identified patent and that said Letters Patent is hereby corrected as shown below.

Column 6, line 67,
   Claim 1, line 3, please delete "dam" and insert --data--.

Signed and Sealed this

Second Day of September, 1997

*Attest:*

BRUCE LEHMAN

*Attesting Officer*     *Commissioner of Patents and Trademarks*